US008765536B2

(12) United States Patent
Assefa et al.

(10) Patent No.: US 8,765,536 B2
(45) Date of Patent: Jul. 1, 2014

(54) STRESS ENGINEERED MULTI-LAYERS FOR INTEGRATION OF CMOS AND SI NANOPHOTONICS

(71) Applicant: International Business Machines Corporation, Armonk, NY (US)

(72) Inventors: Solomon Assefa, Ossining, NY (US); Tymon Barwicz, Yorktown Heights, NY (US); Swetha Kamlapurkar, Ossining, NY (US); Marwan H. Khater, Astoria, NY (US); Steven M. Shank, Essex Junction, NY (US); Yurii A. Vlasov, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/629,910

(22) Filed: Sep. 28, 2012

(65) Prior Publication Data

US 2014/0091374 A1    Apr. 3, 2014

(51) Int. Cl.
*H01L 29/66*    (2006.01)

(52) U.S. Cl.
USPC ............ 438/155; 438/48; 257/E31.122

(58) Field of Classification Search
CPC ............ H01L 29/7842; H01L 29/7843; H01L 27/14643; H01L 27/14612
USPC ............ 438/48, 60, 66, 69, 70, 75, 155; 257/E31.122
See application file for complete search history.

(56) References Cited

U.S. PATENT DOCUMENTS

| | | | |
|---|---|---|---|
| 6,798,033 B2 | 9/2004 | Chao et al. | |
| 7,186,611 B2 | 3/2007 | Hsu et al. | |
| 7,259,050 B2 | 8/2007 | Chen et al. | |
| 7,385,167 B2 | 6/2008 | Li et al. | |
| 7,418,166 B1 | 8/2008 | Kapur et al. | |
| 7,763,499 B2 | 7/2010 | Li et al. | |
| 7,968,915 B2 | 6/2011 | Kanarsky et al. | |
| 8,053,870 B2 | 11/2011 | Anderson et al. | |
| 8,110,885 B2 * | 2/2012 | Iida et al. | 257/437 |
| 8,241,942 B2 * | 8/2012 | Bourdelle et al. | 438/75 |
| 2003/0235931 A1 * | 12/2003 | Wada et al. | 438/22 |
| 2009/0008718 A1 | 1/2009 | Pei et al. | |
| 2010/0099268 A1 * | 4/2010 | Timans | 438/761 |
| 2010/0173127 A1 | 7/2010 | Lieten et al. | |
| 2010/0295083 A1 * | 11/2010 | Celler | 257/98 |
| 2011/0027950 A1 * | 2/2011 | Jones et al. | 438/155 |
| 2013/0001722 A1 * | 1/2013 | Chen et al. | 257/432 |
| 2013/0001723 A1 * | 1/2013 | Meade | 257/432 |
| 2013/0087837 A1 * | 4/2013 | Chang et al. | 257/288 |
| 2013/0119500 A1 * | 5/2013 | Weng et al. | 257/435 |
| 2013/0134540 A1 * | 5/2013 | Maeda et al. | 257/432 |

OTHER PUBLICATIONS

International Search Report and Written Opinion, PCT/2013/055243, Jan. 7, 2014.

* cited by examiner

*Primary Examiner* — Julia Slutsker
(74) *Attorney, Agent, or Firm* — Keivan Razavi; Michael Lestrange (57) ABSTRACT

A method of forming an integrated photonic semiconductor structure having a photonic device and a CMOS device may include depositing a first silicon nitride layer having a first stress property over the photonic device, depositing an oxide layer having a stress property over the deposited first silicon nitride layer, and depositing a second silicon nitride layer having a second stress property over the oxide layer. The deposited first silicon nitride layer, the oxide layer, and the second silicon nitride layer encapsulate the photonic device.

18 Claims, 6 Drawing Sheets

STRESS ENGINEERED MULTI-LAYERS FOR INTEGRATION OF CMOS AND SI NANOPHOTONICS

BACKGROUND a. Field of the Invention

The present invention generally relates to semiconductor devices, and particularly to integrated photonic semiconductor devices.

b. Background of Invention

The use of both photonic devices in high-speed switching and transceiver devices in data communications are but a few examples that highlight the advantages of processing both optical and electrical signals within a single integrated device. For example, an integrated photonic device may include both photodetector and CMOS type devices that may be fabricated on a single silicon substrate. However, during the fabrication process, certain processes, while benefiting or being necessary for the formation and/or operation of one type of device (e.g., CMOS FET), may be detrimental to the formation and/or operation of the other type of device (e.g., Photodetector).

It may therefore, among other things, be advantageous to maintain, within an integrated photonic device, the integrity of both photonic and non-photonic type devices during fabrication processes.

BRIEF SUMMARY

According to at least one exemplary embodiment, a method of forming an integrated photonic semiconductor structure having a photonic device and a CMOS device may include depositing a first silicon nitride layer having a first stress property over the photonic device, depositing an oxide layer having a stress property over the deposited first silicon nitride layer, and depositing a second silicon nitride layer having a second stress property over the oxide layer. The deposited first silicon nitride layer, the oxide layer, and the second silicon nitride layer encapsulate the photonic device.

According to at least one other exemplary embodiment, an integrated photonic semiconductor structure may include a substrate, a photonic device located on the substrate, and a CMOS device also located on the substrate and electrically isolated from the photonic device. The structure may further include a multi-layer stack having a first silicon nitride layer having a first stress property, an oxide layer having a stress property, and a second silicon nitride layer having a second stress property, whereby the multi-layer stack encapsulates the photonic device. The first silicon nitride layer may be located over the photonic device, the oxide layer may be located over the first silicon nitride layer, and the second silicon nitride layer may be located over the oxide layer.

According to at least one other exemplary embodiment, a design structure tangibly embodied in a machine readable medium for designing, manufacturing, or testing an integrated circuit may be provided. The design structure may include a substrate, a photonic device located on the substrate, and a CMOS device also located on the substrate and electrically isolated from the photonic device. The structure may further include a multi-layer stack having a first silicon nitride layer having a first stress property, an oxide layer having a stress property, and a second silicon nitride layer having a second stress property, whereby the multi-layer stack encapsulates the photonic device. The first silicon nitride layer may be located over the photonic device, the oxide layer may be located over the first silicon nitride layer, and the second silicon nitride layer may be located over the oxide layer.

BRIEF DESCRIPTION OF THE SEVERAL VIEWS OF THE DRAWINGS

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

The following structure and processes provide exemplary embodiments of a CMOS integrated nanophotonics device that includes, for example, both a photonic device such as a germanium (GE) photodetector and a CMOS device such as an FET transistor. Within CMOS integrated nanophotonic circuits, crystalline materials such as germanium or III-V compounds may be utilized as an active element of the photodetector component based on their high quantum efficiency. Using a rapid melt growth technique, films (e.g., germanium) can be deposited at low temperatures in an amorphous state using techniques such as physical vapor deposition (PVD), plasma enhanced chemical vapor deposition (PECVD), and rapid thermal chemical vapor deposition (RTCVD), and subsequently crystallized thermally. During the crystallization process, the germanium material forming the photodetector active region may be encapsulated, using a multi-layer film stack, in order to prevent crystalline defects and contamination as a result of outdiffusion. Thus, an encapsulating multi-layer film stack according to one or more exemplary embodiments is described.

In order to produce a single crystalline germanium active region, a deposited germanium film may be crystallized by heating the semiconductor wafer over which the germanium film is deposited to about 1100 degrees centigrade (° C.). At around 940° C., the germanium film transforms from a solid state to a liquid state. During a subsequent cooling stage, the liquid germanium is transformed back to a solid as a single crystalline germanium material for forming, for example, a photodetector active region. If during this germanium crystallization process, an encapsulation stack is not utilized, liquid and/or gaseous formed germanium may contaminate other parts of the semiconductor wafer and/or the process chambers (e.g., chamber used for thermal annealing).

Alternatively, if an encapsulation stack is used, the encapsulation stack should be implemented to withstand the stresses caused during, for example, the germanium crystallization process. If one or more cracks occur in the encapsulation stack, the germanium may outdiffuse and cause contamination of the integrated device and/or process chambers. Additionally, the existence of cracks in the encapsulation may subject the underlying germanium to chemical attacks caused by subsequent wet cleans. For example, during the silicide formation process, the chemicals used during the wet clean process may come into contact with the germanium via any cracks in the encapsulation stack. Consequently, all or parts of the germanium may be dissolved by the wet clean chemicals.

According to the following exemplary embodiments, an encapsulating multi-layer film stack may be formed from multiple oxide and nitride layers each having certain stress properties in order to minimize and avoid the above-mentioned cracking and resulting contamination.

Figure 1A:
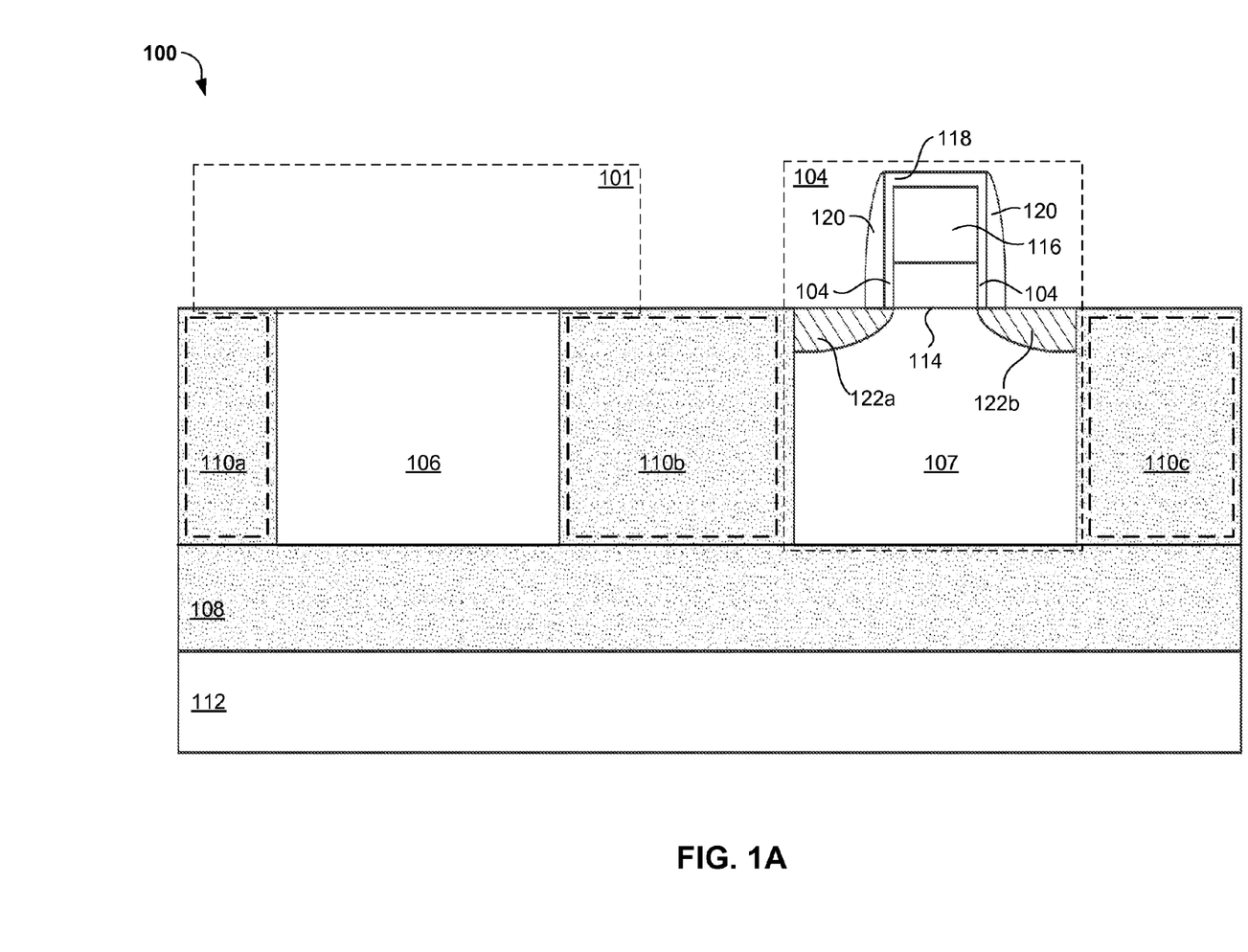
FIGS. 1A-1E are vertical cross-sectional views of an integrated photonic semiconductor device structure during the formation of an encapsulating multi-layer film stack according to one or more exemplary embodiments.

FIGS. 1A-1E are vertical cross-sectional views of an integrated photonic semiconductor device structure during the formation of an encapsulating multi-layer film stack according to an exemplary embodiment. Referring to FIG. 1A, an integrated photonic semiconductor structure 100 is illustrated. The integrated photonic semiconductor structure 100 may include a photonic device formation region 101 for fabricating, for example, a Germanium (GE) photodetector (FIG. 1B: photodetector 102) and a CMOS device such as an FET transistor 104. The integrated photonic semiconductor structure 100 may further include an optical waveguide structure 106, a buried oxide (BOX) region 108, shallow trench isolation (STI) regions 110a-110c, and a silicon substrate 112. The BOX region 108 is located over the silicon substrate 112. The optical waveguide structure 106 may be formed within a silicon-on-insulator (SOI) layer (not shown) of structure 100, whereby the STI regions 110a-110b and BOX region 108 surrounding the waveguide 106 facilitate optical confinement (i.e., cladding) and low-loss waveguiding. In addition, STI region 110b may provide electrical isolation between a subsequently formed Germanium (Ge) photodetector within region 101 and the FET transistor 104. As depicted, the formed CMOS FET transistor 104 may include a gate dielectric 114, a polysilicon gate 116, spacer oxide regions 118, spacer nitride regions 120, source/drain (S/D) regions 122a, 122b, and halo and extension implants (not shown). Well region 107 and the S/D regions 122a, 122b of FET transistor 104 are also formed within the silicon-on-insulator (SOI) layer (not shown).

Figure 1B:
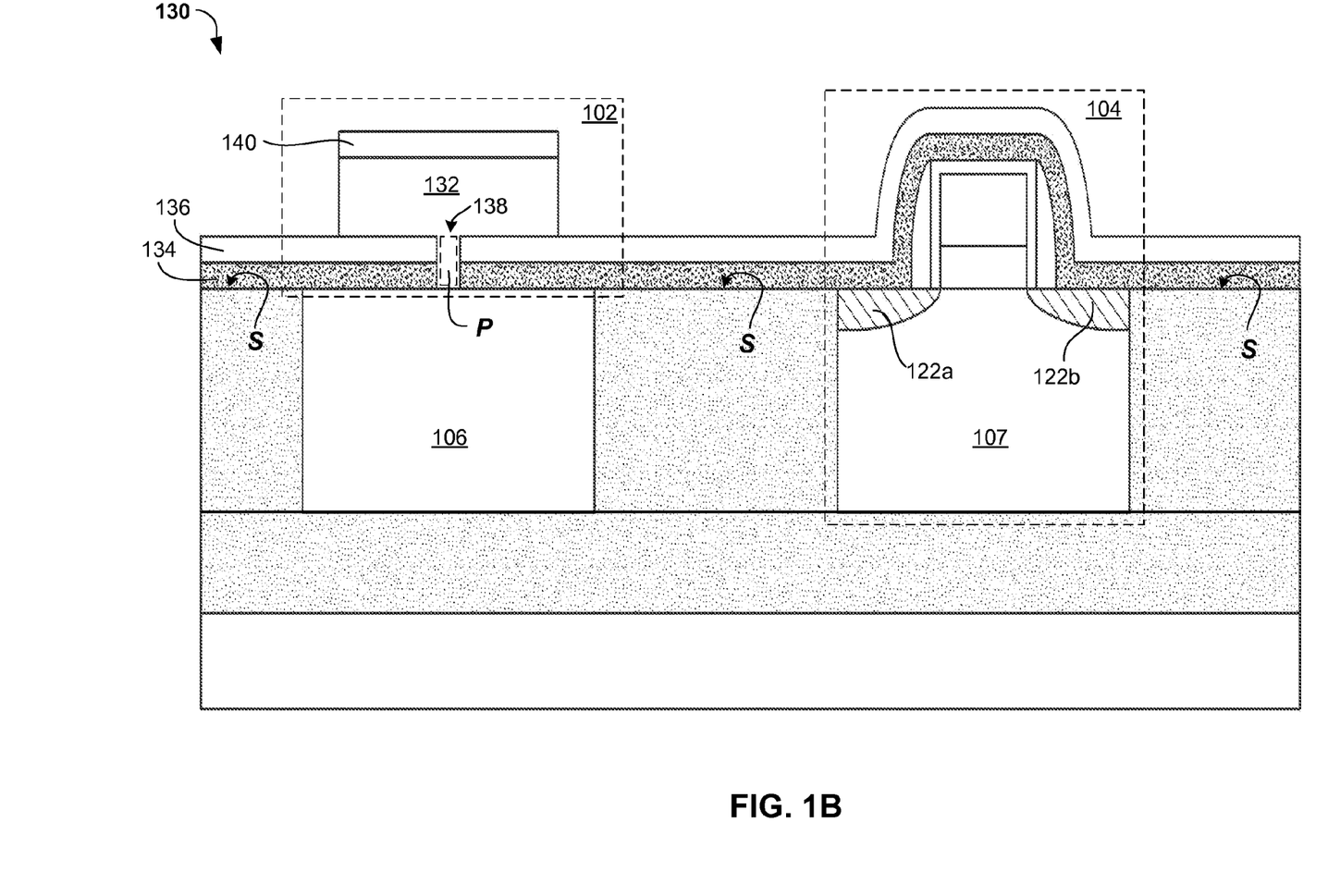

Referring to FIG. 1B, integrated photonic device structure 130 includes the formation of a GE active region 132 within structure 100 of FIG. 1A. Prior to forming of the GE active region 132, a thin oxide layer 134 of about 50 Angstroms (Å) and a thin silicon nitride layer 136 of approximately 400 Å may be formed over both the surface S of the integrated photonic device structure 102 and the CMOS FET transistor 104. As depicted, an opening 138 may be formed within the oxide layer 134 and silicon nitride layer 136 down to the surface S of the integrated photonic device structure 130. During the formation of the GE active region 132, a portion of the GE active region 132, as defined by P, fills opening 138 in order for the GE active region 132 to establish contact with the silicon material of optical waveguide 106. The contact area defined by P enables the GE active region 132 to utilize the silicon material of optical waveguide 106 as a seed layer during the crystallization process of the GE active region 132 at a later process stage. However, as illustrated, the remaining portions of the GE active region 132 may be isolated from the silicon optical waveguide 106 by the thin oxide layer 134 and thin silicon nitride layer 136. The isolation between the remaining portions of the GE active region 132 and the silicon optical waveguide 106 may facilitate the avoidance of the intermixing of germanium from the GE active region 132 with the silicon of the optical waveguide 106. For example, one effect of such intermixing would be to reduce the responsivity of the GE active region 132 and consequently the formed photodetector 102.

The optical signal traversing within the optical waveguide structure 106 may be received by the active region 132 through the thin oxide layer 134 and a thin silicon nitride layer 136. Although any received optical signal received by the active region 132 is attenuated by thin layers 134 and 136, based on the thickness of these layers 134, 136, the attenuation is low enough in order to not impede the operation and sensitivity of the photodetector 102.

A silicon nitride ($Si_3N_4$) hard mask layer 140 is also formed over the top surface of the GE active region 132. The silicon nitride ($Si_3N_4$) hard mask layer 140 is deposited and utilized during the patterning and etching of a germanium mesa used in the formation of GE active region 132. The silicon nitride ($Si_3N_4$) hard mask layer 140 may also provide a contact etch barrier, whereby the mask layer 140 avoids or minimizes any etching into the germanium material of the GE active region 132 during the formation of, for example, a Schottky contact (not shown). In addition, the mask layer 140 may serve as a top surface encapsulation layer for the GE active region 132.

As illustrated in FIG. 1B, the thin oxide layer 134 also covers FET transistor 104. The oxide layer 134 may act as a screen-oxide layer for controlling implant deposition into the source/drain (S/D) regions 122a, 122b of the FET transistor 104 and, thus, providing repeatable implant profiles to minimize device variability and protecting the S/D region silicon from damage that may be caused by the implantation process. Oxide layer 134 may also include tensile or compressive strain properties that provide a controlled stress on the FET transistor 104 for modifying the electrical device characteristics of the FET transistor 104. For example, the oxide layer 134 may provide a compressive stress on the S/D regions 122a, 122b, which in turn may increase carrier-mobility and, therefore, enhance, among other things, the operational switching speed of the FET transistor 104.

Figure 1C:
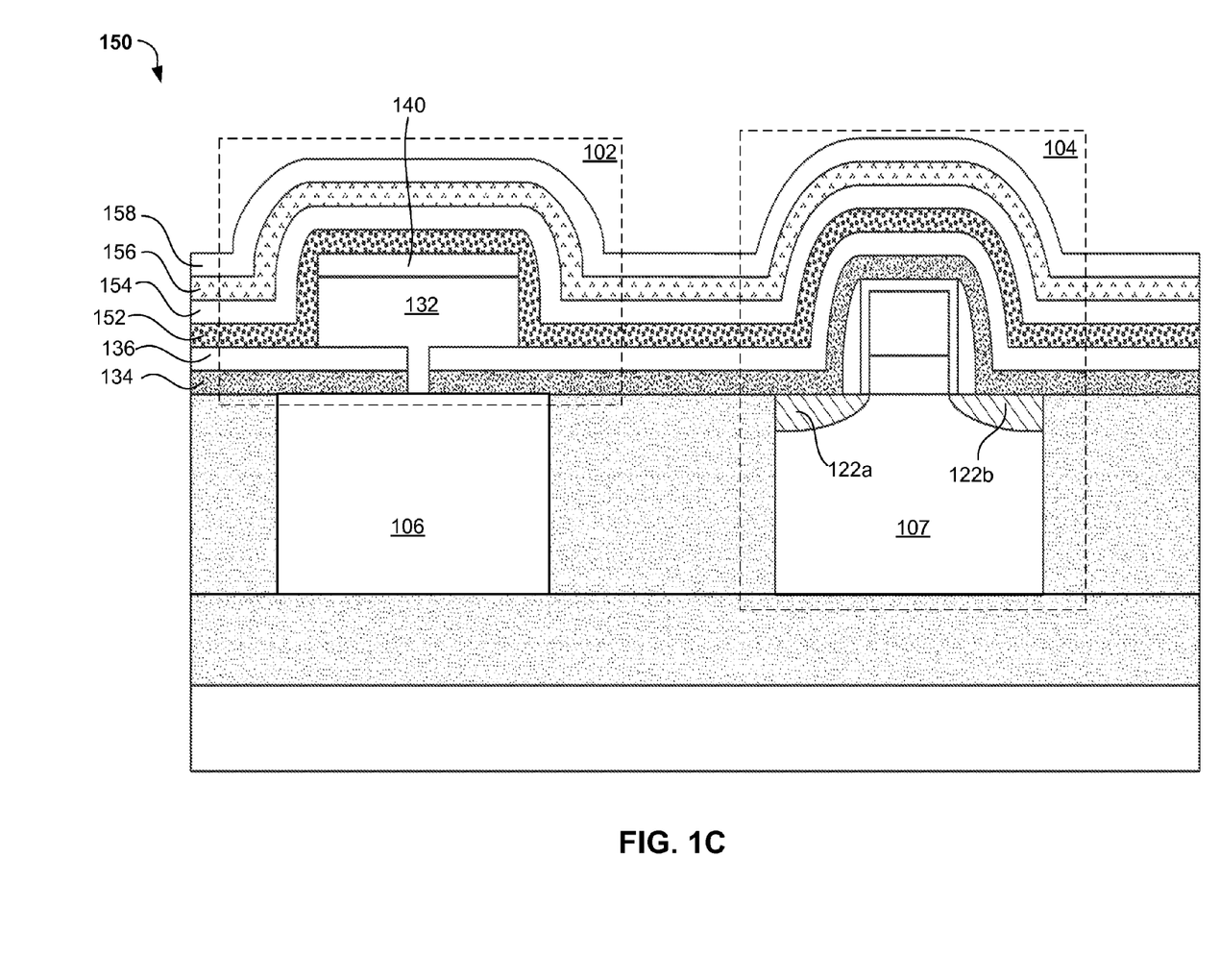

Referring to FIG. 1C, integrated photonic device structure 150 includes the formation of encapsulation stack layers 152-158 within structure 130 of FIG. 1B. As illustrated, a stressed silicon nitride layer 152 may be deposited over silicon nitride layer 136 using a low stress plasma enhanced chemical vapor deposition (PECVD) process. The stressed silicon nitride layer 152 may include low compressive stress properties of about −200 Mega Pascal (MPa) or less and have a thickness in the range of about 100-1000 Å. Preferably, stressed silicon nitride layer 152 may have a thickness of approximately 500 Å and act as a buffer layer for subsequently deposited stressed layers such as, for example, oxide layer 154 and silicon nitride layer 156. In some implementations, the stressed silicon nitride layer 152 may include high-stress properties in order to provide a controlled stress on the FET transistor 104 for modifying its electrical device characteristics. Thus, silicon nitride layer 152 may also, for example, provide a compressive or tensile stress on the S/D regions 122a, 122b, which in turn may selectively increase or decrease carrier-mobility and, therefore, control, among other things, the operational switching speed of FET transistor 104. In an implementation where the silicon nitride layer 152 includes a high tensile stress property of, for example, about 1000 MPa, the tensile stress may be transferred from the silicon nitride layer 152 to the underlying FET transistor 104. If the underlying FET transistor 104 is an nFET device, based on the tensile stress, carrier mobility in the channel of the nFET may be increased. Conversely, if the underlying FET transistor 104 is a pFET device, carrier mobility in the channel of the pFET may be decreased by the applied tensile stress. Alternatively, in an implementation where the silicon nitride layer 152 includes a high compressive stress property of, for example, about −1000 MPa, the compressive stress may also be transferred from the silicon nitride layer 152 to the underlying FET transistor 104. If the underlying FET transistor 104 is an nFET device, based on the compressive stress, carrier mobility in the channel of the nFET may be decreased. Conversely, if the underlying FET transistor 104 is a pFET device, the compressive stress may cause an increase in the carrier mobility of the pFET channel. Silicon nitride layer 152 may therefore include a stress property ranging from −1000 MPa (compressive) to 1000 MPa (tensile).

A stressed oxide layer 154 may then be deposited over silicon nitride layer 152 using a compressive PECVD deposition process. The compressive oxide layer 154 may include stress properties of about −500 MPa and have a thickness in the range of about 100-2000 Å. Preferably, compressive oxide layer 154 may have a thickness of approximately 500 Å and mitigates germanium expansion during the crystallization melt process of the GE active region 132. It may be appreciated that higher or lower tensile or compressive stress properties may also be contemplated. For example, stressed oxide layer 154 may include a stress property ranging from −1000 MPa (compressive) to 1000 MPa (tensile).

A stressed silicon nitride layer 156 may be deposited over compressive oxide layer 154 using a compressive PECVD deposition process. The compressive silicon nitride layer 156 may include stress properties of about −1000 MPa and have a thickness in the range of about 500-3000 Å. Preferably, compressive silicon nitride layer 156 may have a thickness of approximately 1000 Å and mitigates germanium expansion during the crystallization melt process. The compressive silicon nitride layer 156 may have a density of about 2.4 g/cm³. It may be appreciated that higher or lower compressive stress properties may also be contemplated. For example, stressed silicon nitride layer 156 may include a stress property ranging from 0MPa (no strain) to −2000 MPa (compressive).

Another stressed silicon nitride layer 158 may optionally be deposited over compressive silicon nitride layer 156 using a tensile RTCVD deposition process. The tensile silicon nitride layer 158 may include tensile stress properties of about 1000 MPa and have a thickness in the range of about 500-2000 Å. Preferably, tensile silicon nitride layer 158 may have a thickness of approximately 1000 Å and acts as a sealant of seams and controller of PECVD morphology. The tensile silicon nitride layer 158 may have a density of about 3.4 g/cm³. It may be appreciated that higher or lower tensile stress properties may also be contemplated. For example, stressed silicon nitride layer 158 may include a stress property ranging from 0MPa (no strain) to 2000 MPa (tensile).

Referring to FIG. 1C, in one embodiment, an encapsulating multi-layer film stack may be formed by stressed silicon nitride layer 152, compressive oxide layer 154, and compressive silicon nitride layer 156. In another embodiment, the encapsulating multi-layer film stack may be formed by stressed silicon nitride layer 152, compressive oxide layer 154, compressive silicon nitride layer 156, and optional tensile silicon nitride layer 158. In yet another embodiment, silicon nitride hard mask layer 140 may also be included in the encapsulating multi-layer film stack, as well as oxide layer 134 and nitride layer 136. In the above exemplary embodiments, the stress may be graded in an increased manner for each additional layer of the encapsulating multi-layer film stack that covers the silicon nitride hard mask layer 140. For example, a low stress silicon nitride layer 152 of less than −200 MPa, a medium stress compressive oxide layer 154 of about −500 MPa, and a high stress compressive silicon nitride layer 156 of about −1000 MPa may be used to form the encapsulating multi-layer film stack.

Figure 1D:
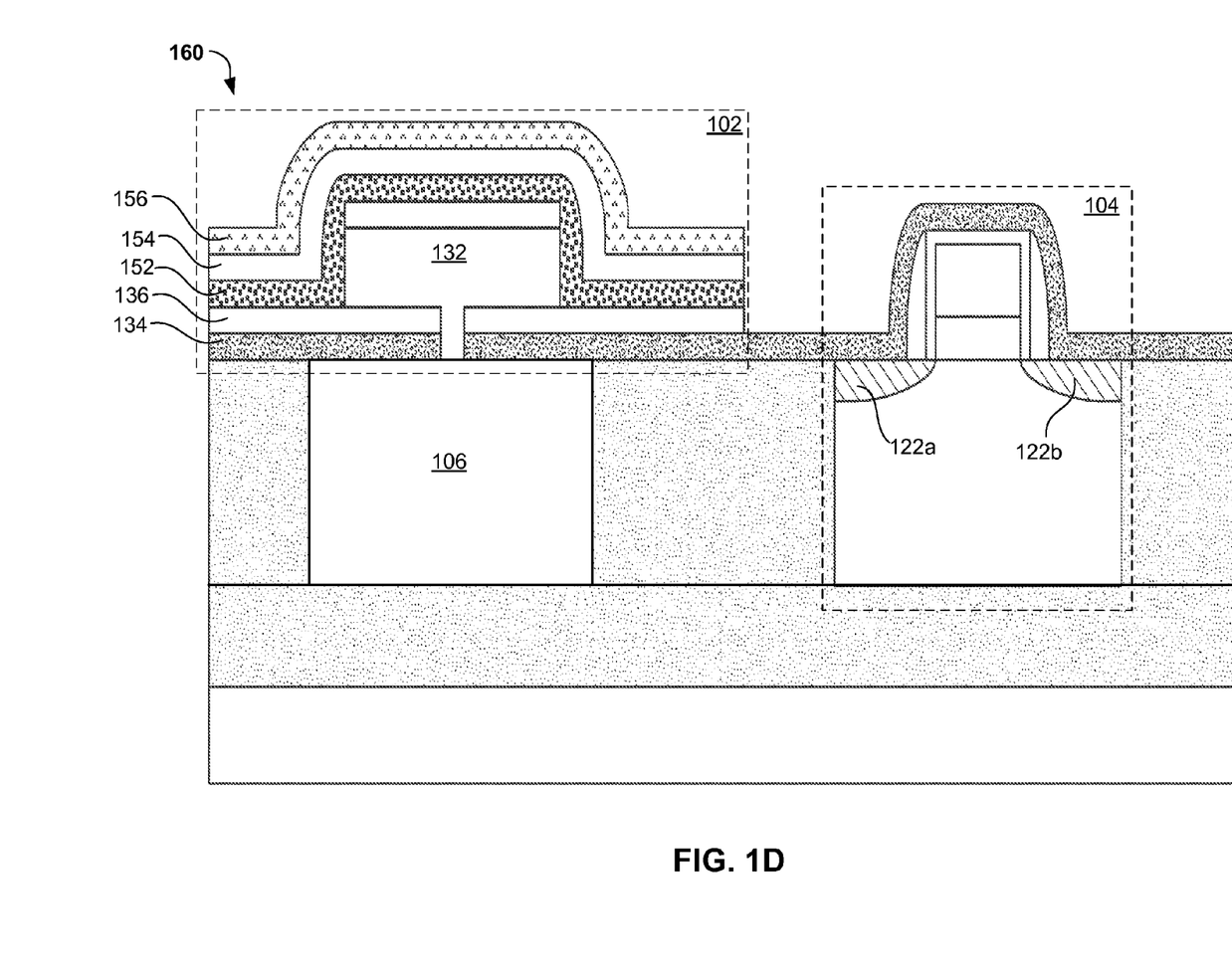

Referring to FIG. 1D, integrated photonic device structure 160 includes the removal of encapsulation stack layers 152-158 from the FET device 104 within structure 150 of FIG. 1C. As illustrated, layers 136 and 152-158 are etched away from the FET device 104. Although the depicted embodiment of FIG. 1D precludes optional tensile silicon nitride layer 158, in some embodiments this layer 158 may be retained (see FIG. 1C) over the compressive silicon nitride layer 156 covering the photodetector 102. During the crystallization process, the germanium material forming the photodetector active region may now be encapsulated using stressed silicon nitride layer 152, compressive oxide layer 154, and compressive silicon nitride layer 156. However, as previously described, during germanium crystallization, the germanium may outdiffuse from one or more cracks in encapsulation layers and cause contamination of the integrated device and/or process chambers. Moreover, the existence of such cracks in the encapsulation layers may subject the underlying germanium to chemical attacks caused by subsequent wet cleans. Accordingly, encapsulating multi-layer film stack 152-156 and their corresponding stress properties mitigate the above-mentioned cracking and resulting contamination associated with either or both the photodetector 102 (e.g., wet clean germanium erosion) and/or FET transistor 104 (e.g., outdiffused germanium contamination).

According to one aspect, once the exemplary encapsulating multi-layer film stack 152-156 is formed, a simultaneous dopant activation associated with FET transistor 104 and crystallization process associated with the GE active region 132 may be accomplished using a spike anneal. The spike anneal may, for example, include heating the integrated photonic device structure 160 to a temperature of about 950-1100° C. for a time period of less than one (1) second using a temperature ramp of about 50° C./sec. During the spike anneal process, implanted dopants (e.g., arsenic, phosphorous, boron, etc.) within the S/D regions 122a, 122b of the FET transistor 104 are chemically activated and bond with their surrounding silicon atoms. Also, during the same spike anneal process, the germanium material of the GE active region 132 is crystallized from an amorphous state.

Figure 1E:
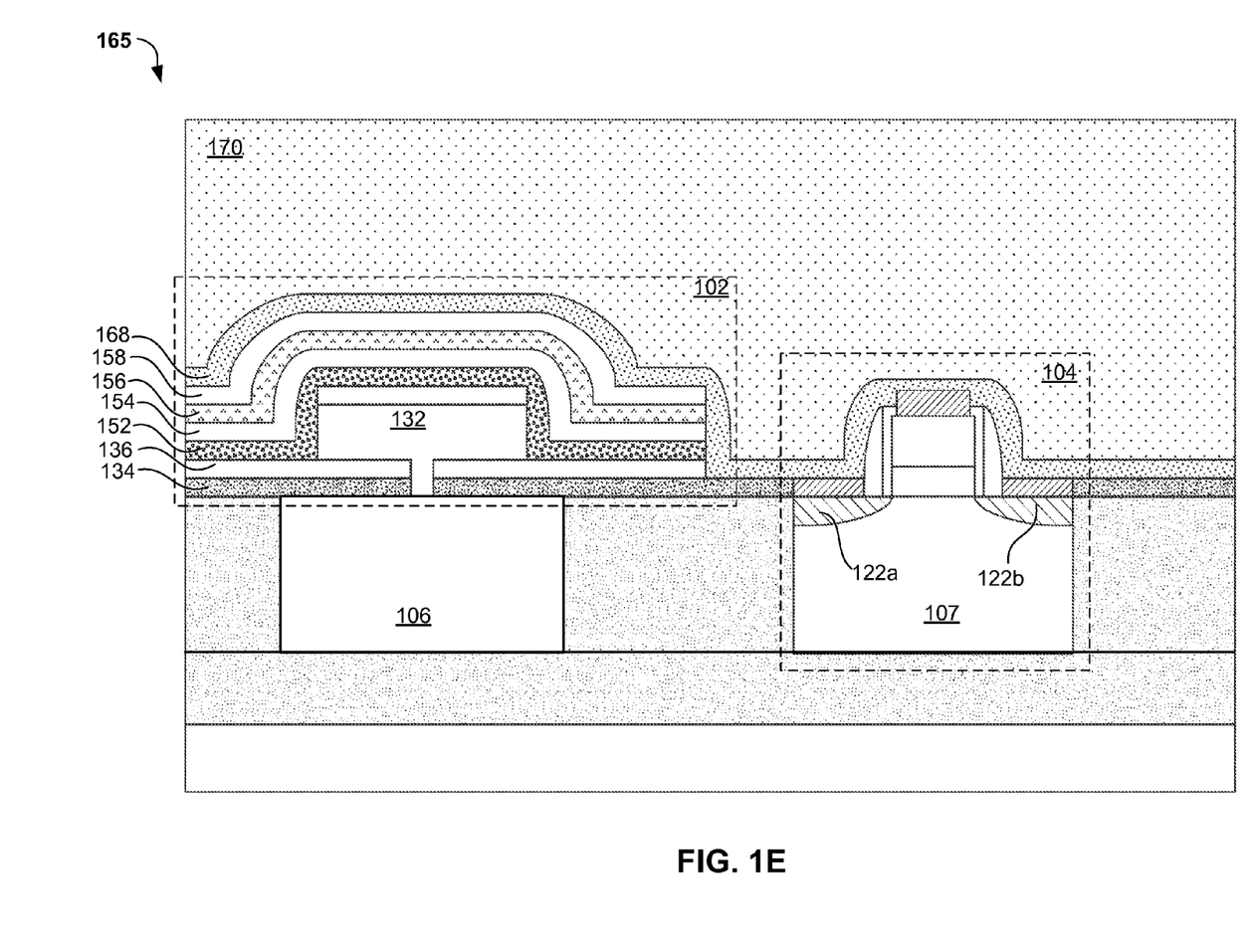

Referring to FIG. 1E, integrated photonic device structure 165 includes the deposition of an additional silicon nitride layer 168 over both the FET device 104 and photodetector 102 within structure 160 of FIG. 1D. As illustrated, optional tensile silicon nitride layer 158 is also included within the encapsulating multi-layer film stack. Thus, in the embodiment of FIG. 1E, the encapsulating multi-layer film stack may include stressed silicon nitride layer 152, compressive oxide layer 154, compressive silicon nitride layer 156, and optional tensile silicon nitride layer 158. The additional silicon nitride layer 168 may be deposited over optional tensile silicon nitride layer 158. Also, as depicted, a thick oxide layer (e.g., 1 µm thickness) of borophosphosilicate glass (BPSG) 170 may be deposited over the formed additional layer 168 and planarized using, for example, chemical mechanical polishing (CMP). The BPSG layer 170 may be used in subsequent contact formation steps (not shown) corresponding to both the germanium (GE) photodetector 102 and the FET transistor 104.

As illustrated in FIG. 1E, according to one embodiment, the additional silicon nitride layer 168 may also include tensile (e.g., 1000 MPa) or compressive stress (e.g., −1000 MPa) properties for exerting a stress on the FET transistor 104. For example, additional silicon nitride layer 168 may include a stress property ranging from −2000 MPa (compressive) to 2000 MPa (tensile). In such an embodiment, the multi-layer encapsulation including, for example, layers 152-158, may shield the underlying GE active region 132 of the photodetector 102 from the stress applied via silicon nitride layer 168 to the FET transistor 104. For example, as previously described, providing stress to the FET transistor 104 may alter its electrical characteristics in a desirable manner. For example, additional stress on the S/D regions 122a, 122b may increase carrier mobility. In some instances, the applied stress on the S/D regions 122a, 122b may be used to tune or optimize any existing stress characteristics within the S/D regions 122a, 122b. In some embodiments, it may be desirable to apply stress to both the photonic device portion and the CMOS device portion of the integrated photonic device.

For example, referring back to FIG. 1C, the various stress properties of the encapsulating multi-layer film stack formed by stressed silicon nitride layer 152, compressive oxide layer 154, compressive silicon nitride layer 156, and optional tensile silicon nitride layer 158, may provide stress to both the photodetector 102 and the FET transistor 104. Applied stress to the photodetector 102 may create a desired controlled change in one or more optical properties associated with the photodetector 102. Alternatively, in some embodiments, instead of a photodetector, other photonic devices such as laser sources or optical amplifiers may also be contemplated, whereby the application of stress may cause for example, a wavelength shift or amplifier gain change.

Accordingly, the foregoing described embodiments may provide, among other things, photonic device encapsulation during individual or simultaneous processing associated with the integrated photonic device, as well as facilitating changes in the optical and/or electrical operating characteristics of the devices incorporated with the integrated photonic device based on the application stress during such encapsulation.

Figure 2:
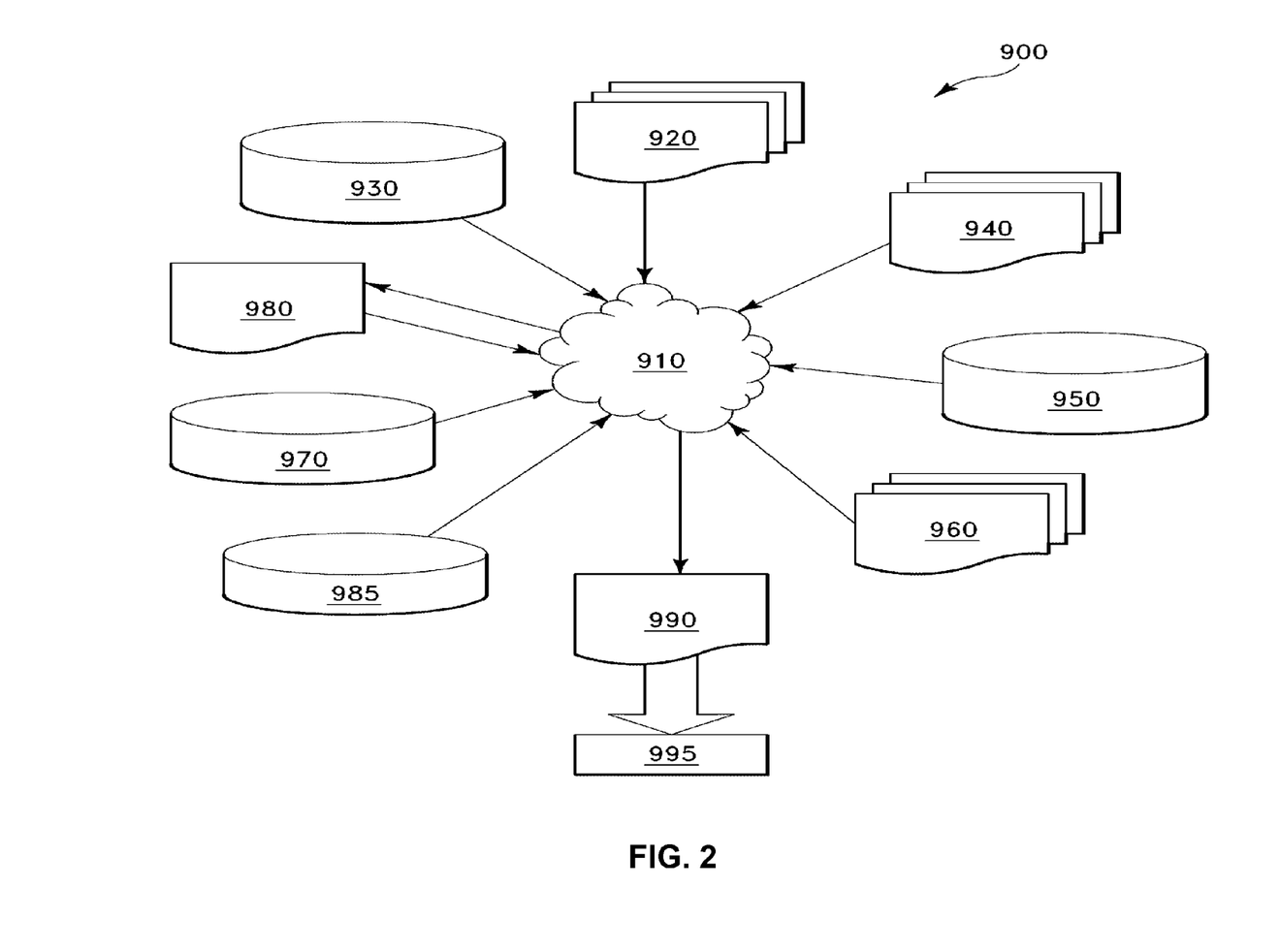
FIG. 2 is a flow diagram of a design process used in semiconductor design, manufacture, and/or test according to an exemplary embodiment.

FIG. 2 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1C-1E. The design structure processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems.

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 2 illustrates multiple such design structures including an input design structure 920 that is preferably processed by a design process 910. In one embodiment, the design structure 920 comprises design data used in a design process and comprising information describing the embodiments of the invention with respect to the structures as shown in FIGS. 1C-1E. The design data in the form of schematics or HDL, a hardware-description language (e.g., Verilog, VHDL, C, etc.) may be embodied on one or more machine readable media. For example, design structure 920 may be a text file, numerical data or a graphical representation of the embodiments of the invention shown in FIGS. 1C-1E. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1C-1E. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structure shown in FIG. 1E to generate a netlist 980 which may contain a design structure such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 20, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990 comprising second design data embodied on a storage medium in a data format used for the exchange of layout data of integrated circuits and/or symbolic data format (e.g. information stored in a GDSII (GDS2), GL1, OASIS, map files, or any other suitable format for storing such design structures). In one embodiment, the second design data resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of the embodiments of the invention shown in FIGS. 1C-1E. In one embodiment, design structure 990 may comprise a compiled, executable HDL simulation model that functionally simulates the devices shown in FIGS. 1C-1E.

Design structure 990 may also employ a data format used for the exchange of layout data of integrated circuits and/or symbolic data format (e.g. information stored in a GDSII (GDS2), GL1, OASIS, map files, or any other suitable format for storing such design data structures).

Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce devices or structures as described above and shown in FIGS. 1C-1E. Design structure 990 may then proceed to a stage 995 where, for example, design structure 990: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiments, the practical application or technical improvement over technologies found in the marketplace, or to enable others of ordinary skill in the art to understand the embodiments disclosed herein.

What is claimed is:

1. A method of forming an integrated photonic semiconductor structure having a photonic device and a CMOS device comprising:
    depositing a first silicon nitride layer having a first stress property over an active region of the photonic device, the first silicon nitride layer in direct contact with opposing sidewalls of the active region;
    depositing an oxide layer having a fifth stress property over the deposited first silicon nitride layer; and
    depositing a second silicon nitride layer having a second stress property over the oxide layer,
    wherein the deposited first silicon nitride layer, the oxide layer, and the second silicon nitride layer encapsulate the photonic device, wherein the deposited first silicon nitride layer, the oxide layer, and the second silicon nitride layer comprise graded stress properties, the oxide layer including a larger stress than the first silicon nitride layer and the second silicon nitride layer having a larger stress than the oxide layer.

2. The method of claim 1, wherein the first stress property associated with the first silicon nitride layer comprises a stress value in the range of about −1000 to 1000 Mega Pascal.

3. The method of claim 2, wherein the fifth stress property associated with the oxide layer comprises a stress value in the range of about −1000 to 1000 Mega Pascal.

4. The method of claim 3, wherein the second stress property associated with the second silicon nitride layer comprises a stress value in the range of about 0 to −2000 Mega Pascal.

5. The method of claim 1, further comprising:
    depositing a third silicon nitride layer having a third stress property over the second silicon nitride layer,
    wherein the deposited first silicon nitride layer, the oxide layer, the second silicon nitride layer, and the third silicon nitride layer encapsulate the photonic device.

6. The method of claim 5, wherein the third stress property associated with the third silicon nitride layer comprises a stress value in the range of about 0 to 2000 Mega Pascal.

7. The method of claim 1, wherein the first silicon nitride layer includes a thickness of about 100-1000 Angstroms.

8. The method of claim 1, wherein the oxide layer includes a thickness of about 100-2000 Angstroms.

9. The method of claim 1, wherein the second silicon nitride layer includes a thickness of about 500-3000 Angstroms.

10. The method of claim 5, wherein the third silicon nitride layer includes a thickness of about 500-2000 Angstroms.

11. The method of claim 1, wherein the first silicon nitride layer, the oxide layer, and the second silicon nitride layer cover the CMOS device.

12. The method of claim 11, wherein the first silicon nitride layer, the oxide layer, and the second silicon nitride layer provide stress to both the photonic device and the CMOS device, the CMOS device located adjacent to the photonic device, the provided stress varying one or more optical properties of the photonic device and varying one or more electrical properties of the CMOS device.

13. The method of claim 1, further comprising:
    depositing a fourth silicon nitride layer having a fourth stress property over the second silicon nitride layer and the CMOS device, wherein the fourth silicon nitride layer applies stress to the CMOS device.

14. The method of claim 13, wherein the fourth stress property associated with the fourth silicon nitride layer comprises a stress value in the range of about −2000 to 2000 Mega Pascal.

15. The method of claim 5, further comprising:
    depositing a fourth silicon nitride layer having a fourth stress property over the third silicon nitride layer and the CMOS device, wherein the fourth silicon nitride layer applies stress to the CMOS device.

16. The method of claim 1, wherein:
    the CMOS device comprises an FET transistor having source/drain regions; and
    the photonic device comprises a photodetector having a germanium active region.

17. The method of claim 16, further comprising:
thermally annealing the integrated photonic device for both simultaneously crystallizing the germanium active region and activating implanted dopant material in the source/drain regions, wherein during the crystallization, germanium material from the germanium active region remains encapsulated by the first silicon nitride layer, the oxide layer, and the second silicon nitride layer.

18. The method of claim 17, wherein the thermally annealing of the integrated photonic device comprises applying a CMOS spike anneal process having a temperature of about 950-1100° C. for a period of less than one second and a temperature ramp of 50° C. per second.

* * * * *